United States Patent [19]

Beery

[11] Patent Number: 4,768,434
[45] Date of Patent: Sep. 6, 1988

[54] PRESSURE DEVELOPMENT APPARATUS FOR IMAGING SHEETS

[75] Inventor: Jack Beery, Miamisburg, Ohio

[73] Assignee: The Mead Corporation, Dayton, Ohio

[21] Appl. No.: 41,561

[22] Filed: Apr. 23, 1987

[51] Int. Cl.$^4$ .............................................. B30B 1/20
[52] U.S. Cl. ................................... 100/157; 100/169; 100/162 B; 100/176; 29/116.2; 118/116; 355/3 FU
[58] Field of Search ..................... 100/169, 157, 162 B, 100/176, 160; 29/116 AD, 113 AD; 118/116, 117; 355/3 FU

[56] References Cited

U.S. PATENT DOCUMENTS

| | | |
|---|---|---|
| Re. 32,126 | 4/1986 | Sasaki . |
| 2,191,144 | 2/1940 | Hornbostel . |
| 3,678,846 | 7/1972 | Bjorkegren . |
| 3,990,391 | 11/1976 | Singh . |
| 4,022,122 | 5/1977 | Moser et al. . |
| 4,145,965 | 3/1979 | Kikuchi et al. . |
| 4,192,229 | 3/1980 | Tsunoi et al. . |
| 4,235,166 | 11/1980 | Tsunoi . |
| 4,305,191 | 12/1981 | Enomoto ........................ 29/116 AD |
| 4,343,234 | 8/1982 | Sasaki . |
| 4,356,764 | 11/1982 | Haugen . |
| 4,372,247 | 2/1983 | Calabrese ............................. 100/176 |
| 4,417,803 | 11/1983 | Kobayashi et al. ............. 100/176 X |
| 4,602,408 | 7/1986 | Noe et al. . |

Primary Examiner—Andrew M. Falik
Attorney, Agent, or Firm—Biebel, French and Nauman

[57] ABSTRACT

Roll-type pressure-treating apparatus, for subjecting sheet or web material to a uniformly high and uniform pressure across a nip, includes a pair of annular pressure rolls mounted in nip-defining relation to each other. Each of the pressure rolls has received internally thereto a crowned loading roll. The crowned loading rolls have ends which are received in journal blocks through which the pressure rolls are loaded, by compression springs. The crowned loading rolls apply a loading force to the respective inside surfaces of the pressure rolls in immediate adjacent relation to the opposite sides of the nip formed therebetween.

7 Claims, 3 Drawing Sheets

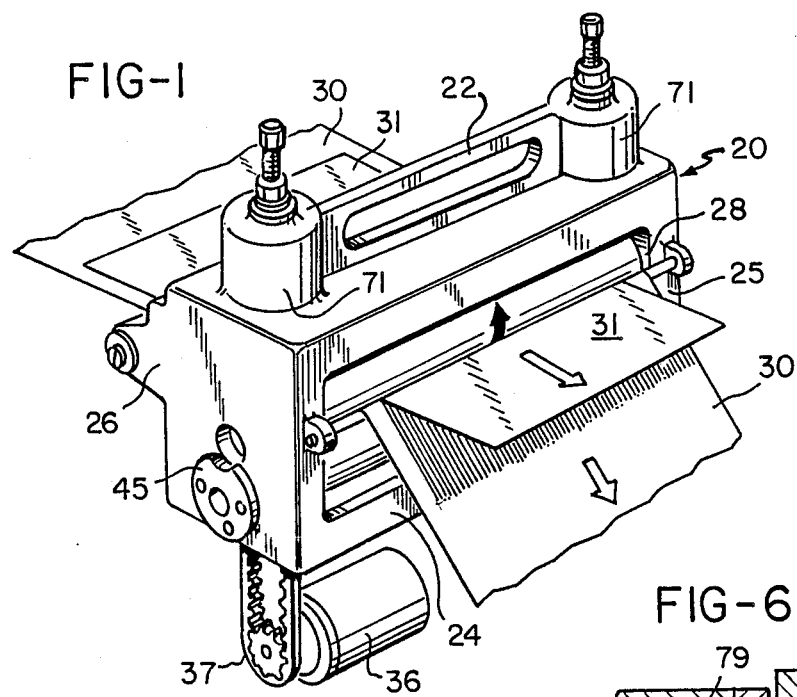
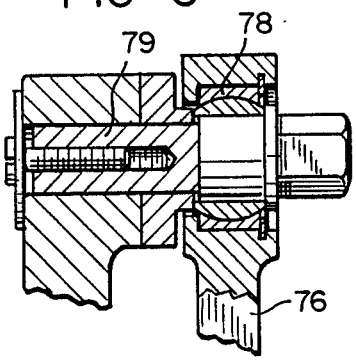
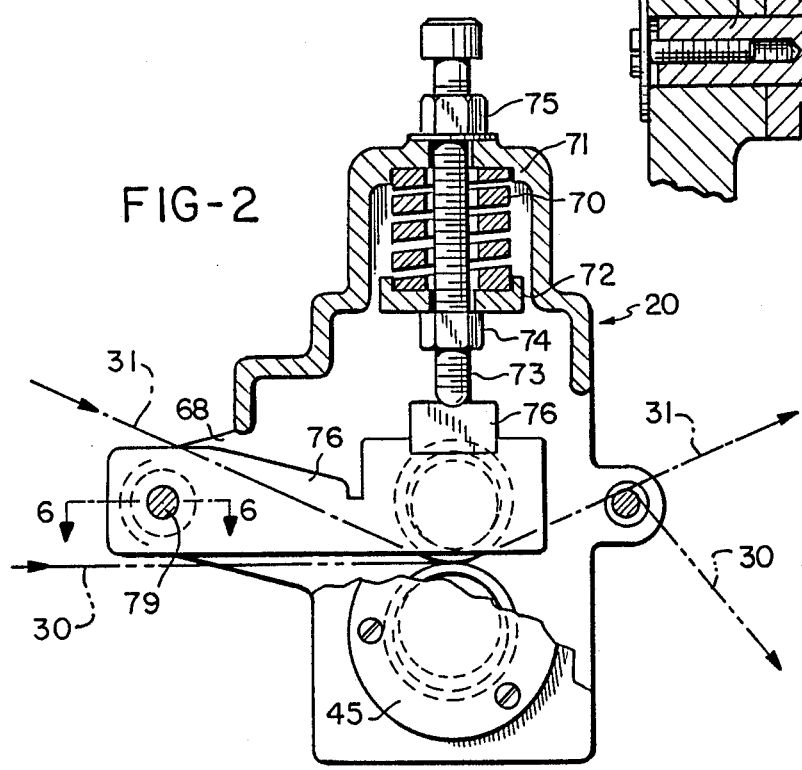

PRESSURE DEVELOPMENT APPARATUS FOR IMAGING SHEETS

The invention relates generally to an imaging system utilizing imaging sheets having a surface coating of rupturable photosensitive microcapsules and, more particularly, to apparatus for rupturing the microcapsules on such imaging sheets.

U.S. Pat. Nos. 4,440,846 and 4,399,209, assigned to the same assignee as this invention and incorporated herein by reference, describe an imaging system wherein a photosensitive layer, comprising microcapsules containing a photosensitive composition in the internal phase, is image-wise exposed to actinic radiation and subjected to a uniform rupturing force whereupon the microcapsules rupture and image-wise release the internal phase. The imaging system is particularly advantageous because it is a totally dry system and does not rely upon the application of wet developing processing solutions to produce the image. An imaging-forming chromogenic material, such as a substantially colorless color former, is typically associated with the microcapsules. When the microcapsules rupture, the color former image-wise reacts with the developer material and produces a color image. In the embodiments described in the referenced patents, the microcapsules are typically ruptured by passing image-wise exposed imaging sheets through the nip between a pair of parallel calender rolls.

The media may exist in either single sheet or two-sheet versions. In the former, the microcapsules developer composition are both coated onto a single substrate layer. In the latter, the microcapsules are carried on a first substrate layer, referred to as a donor sheet. The developer composition is coated onto a second, separate substrate layer, referred to as a receiver sheet. The donor sheet is subjected to the actinic radiation, and the exposed microcapsule layer is then brought into contact with the developer layer of the receiver sheet. The two sheets are then developed by pressure, with the finished image being formed in the receiver sheet.

While heavy pressure is not required to rupture the microcapsules, high pressure and large calender rolls are normally used to develop the imaging sheets. To normalize surface irregularities in the imaging sheets, substantial compression of the paper must be achieved. Thus, the use of large diameter rolls has been considered necessary to achieve a uniform distribution of the rupturing force across the surface of the imaging sheets. Otherwise, if the rupturing force is not uniformly distributed, the imaging sheets develop unevenly and the tonal characteristics of the resulting images are degraded.

One significant complication in applying apparatus for fixing fusible toner images to the development of microencapsulated media sheets is the relative magnitudes of pressure required. Typical pressure roll devices for fixing fusible toner images can apply approximately 1000 lbs/in$^2$. For the microencapsulated media, pressures of 6000 to 8000 lbs/in$^2$ are required.

In pressure fixation apparatus for fixing a dry pressure fusible toner image onto a sheet of paper, it is known to use a pair of pinch rolls biased toward each other and disposed such that the axis of one roll extends at an angle relative to the axis of the other. This skewed arrangement tends to minimize irregularities of the nip between the rolls even when a paper sheet passes therebetween. However, when the skew angle is too large, creases or wrinkles are formed in the paper sheet. In order to avoid such wrinkles in the sheet, the skew angle is kept quite small. With a small skew angle, however, the rolls again must have large diameters to ensure uniform pressure along the nip due to the bending of the rolls. In addition to the added weight of the larger rolls, the loading pressure must also be increased. Hence, larger pressure mechanisms, higher compression-resistant bearings, housings and so forth lead to an increased cost for the apparatus.

To overcome these difficulties in the art of fixing fusible toner images, three roll systems have been used. Such a system is shown in U.S. Pat. No. 4,343,234. In one three roll system, the two upper rolls form a pair of pinch rolls which are disposed parallel and horizontal with a slight skew angle therebetween. A third back-up roll is disposed in a crossing contact relation to the second roll. The back-up roll is biased resiliently upwards toward the second roll of the pair of pinch rolls by a pressure mechanism such that the second roll is butted against the first roll under pressure to form a nip along their contacting line through which paper sheets pass. The bending of the second roll can be adjusted by the cross angle of the back-up roll relative to the second roll such that both the second roll and the back-up roll may have a smaller diameter than the first roll. Even in this case, however, the skew angle between the nip rolls must still be relatively small to avoid wrinkling of the sheets.

Improved pressure development apparatus for imaging sheets employing photosensitive microcapsules, as described above, are disclosed in co-pending application Ser. No. 009,851 filed Feb. 2, 1987 U.S. Pat. No. 4,727,392, incorporated herein by reference. In the co-pending application, the problems introduced by skew angles at the nip or by differential roll speeds at the nip caused by crowned pressure rolls are eliminated by the employment of separate crown rolls which coact with the pressure rolls. This allows the pressure rolls to be cylindrical and free of skew angle and free of differential surface speeds at the nip. In the above-identified copending application, a particularly advantageous arrangement consists of four rolls, two cylindrical pressure rolls in nip-forming relation to each other, each loaded by a crowned roll. This four-roll arrangement eliminates the difficulties which are experienced when using a crowned roll as a nip-forming roll, and eliminates the difficulties of having an off-axis roll at the nip to develop a uniform pressure. However, a four-roll arrangement tends to be bulky and heavy, and requires a correspondingly large frame to accommodate the rolls and the roll journals.

In spite of the improvements which have been made to high pressure roll development apparatus, there exists a need for apparatus which is lighter in weight, which is capable of providing a substantially uniform nip pressure throughout a design width of the roll, and to provide a roll-type pressure developer which is inherently capable of applying a uniform pressure across a nip, over long periods of time, with a minimum of maintenance requirements.

Summary of the Invention

This invention is directed to apparatus for forming images on imaging material, such as sheet material, in which microcapsules contain a photosensitive composition which undergo a change in viscosity upon exposure to actinic radiation, and more particularly to a roll-type pressure developer in which such latent images on sheet material are developed by passing the sheet material between the nip of a pair of cylindrical pressure rolls which exert a high localized pressure along the nip.

The present invention incorporates the advantage of a three or four roll design in a package comparable to that of a two roll system. This is accomplished by providing a hollow or annular nip-forming pressure roll, and incorporating a crowned roll inside the pressure roll. The advantages of a four-roll design are retained by placing a crowned loading roll within each of the pressure rolls.

The pressure rolls are annular in that each has a cylindrical outer surface and a coaxial cylindrical inside surface. The crowned loading roll has a maximum diameter less than the inside diameter of the associated pressure roll, so as to be received within the pressure rolls, in loading engagement to the pressure roll inside surface immediately opposite the nip.

The crowned rolls are loaded through self-aligning bearings, mounted in suitable bearing blocks. Loading forces applied to the crowned rolls cause each loading roll to be pressure biased against its associated annular pressure roll, for the purpose of evenly distributing the pressure across the nip defined between the pressure rolls. The pressure rolls, in turn, are mounted for rotation about the crowned loading rolls on bearing blocks received in the frame.

It is accordingly an important object of the invention to provide a roll-type pressure developing apparatus, providing substantially uniform force distribution along a nip, in which an annular pressure roll is loaded internally by a crowned loading roll.

A further object of the invention is the provision of a four-roll pressure developer, in which a pair of crowned loading rolls are received within a pair of annular pressure rolls.

Another object of the invention is the provision of a two-roll type of developer in which loading rolls are received internally of hollow pressure rolls, and bear on the inside surface of the hollow pressure rolls in immediate adjacent relation to the nip.

These and other objects and advantages of the invention will be apparent from the following description, the accompanying drawings, and the appended claims.

BRIEF DESCRIPTION OF ACCOMPANYING DRAWINGS

FIG. 1 is a perspective view of a pressure developer constructed according to this invention;

FIG. 2 is an enlarged end view, partially broken away, of the roll-type pressure developer of this invention;

FIG. 6 is a sectional view taken generally along the line 6—6 of FIG. 4.

DESCRIPTION OF PREFERRED EMBODIMENT

Figure 3:
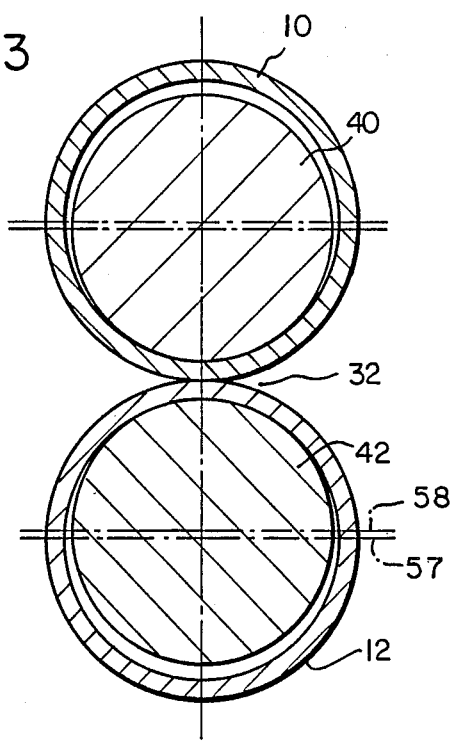
FIG. 3 is an enlarged sectional view through the rolls, illustrating the principles of operations.

Referring to the figures of the drawing, which illustrate a preferred embodiment of the invention, a roll-type pressure developer constructed according to this invention is illustrated in FIG. 1, has an upper pressure roll 10, and a lower pressure roll 12. The rolls are rotatably received within a housing or frame 20. The frame 20 includes an upper cross member 22, a lower cross member 24 joined by end frames 25 and 26.

The sheet material to be developed by the roll-type pressure developer may be either a single sheet or may consist of two sheets, as shown in FIG. 1. In FIG. 1, a donor sheet 30 and a receiver sheet 31 move together in the nip 32 between the pressure rolls 10 and 12, through frame openings 35 formed by the frame 20. The rolls may be driven by means of a suitable motor 36 driving a cog belt 37 over a pulley associated with the second or lower pressure roll 12, as explained in further detail below in association with FIG. 4 of the drawings.

The sheet material 30, 31 may be made in accordance with the teachings of U.S. Pat. No. 4,399,209 issued Aug. 16, 1983. Also in accordance with the teachings of that patent, images are formed by exposing a coated composition containing a chromogenic material and the encapsulated photosensitive composition to actinic radiation, and thereafter rupturing the capsules in the presence of a developer carried on the receiving sheet 31. The capsules are ruptured by the application of a high uniform pressure in the nip 32 between the pair of rolls, as more fully explained in the previously identified copending application Ser. No. 009,851. Due to the high linear unit pressure involved, it is important that the roll-type pressure developer operate on the web or sheets therebetween without differential slippage which could cause the web to wrinkle. Such differential slippage may occur when a crowned roll is in direct contact with the web at a nip formed with a cylndrical roll, or when one of the rolls is operated at a skewed angle to the other.

In accordance with the present invention, a preferred four-roll design includes the pair of primary pressure rolls 10 and 12, each formed as an annulus or as a shell, as illustrated in FIG. 3. Each of the pressure rolls 10, 12 contains a crowned loading roll 40, 42. The crowned rolls have an effective axial length equal substantially to the width of the sheet material to be received within the nip 32 between the primary rolls 10, 12.

Figure 4:
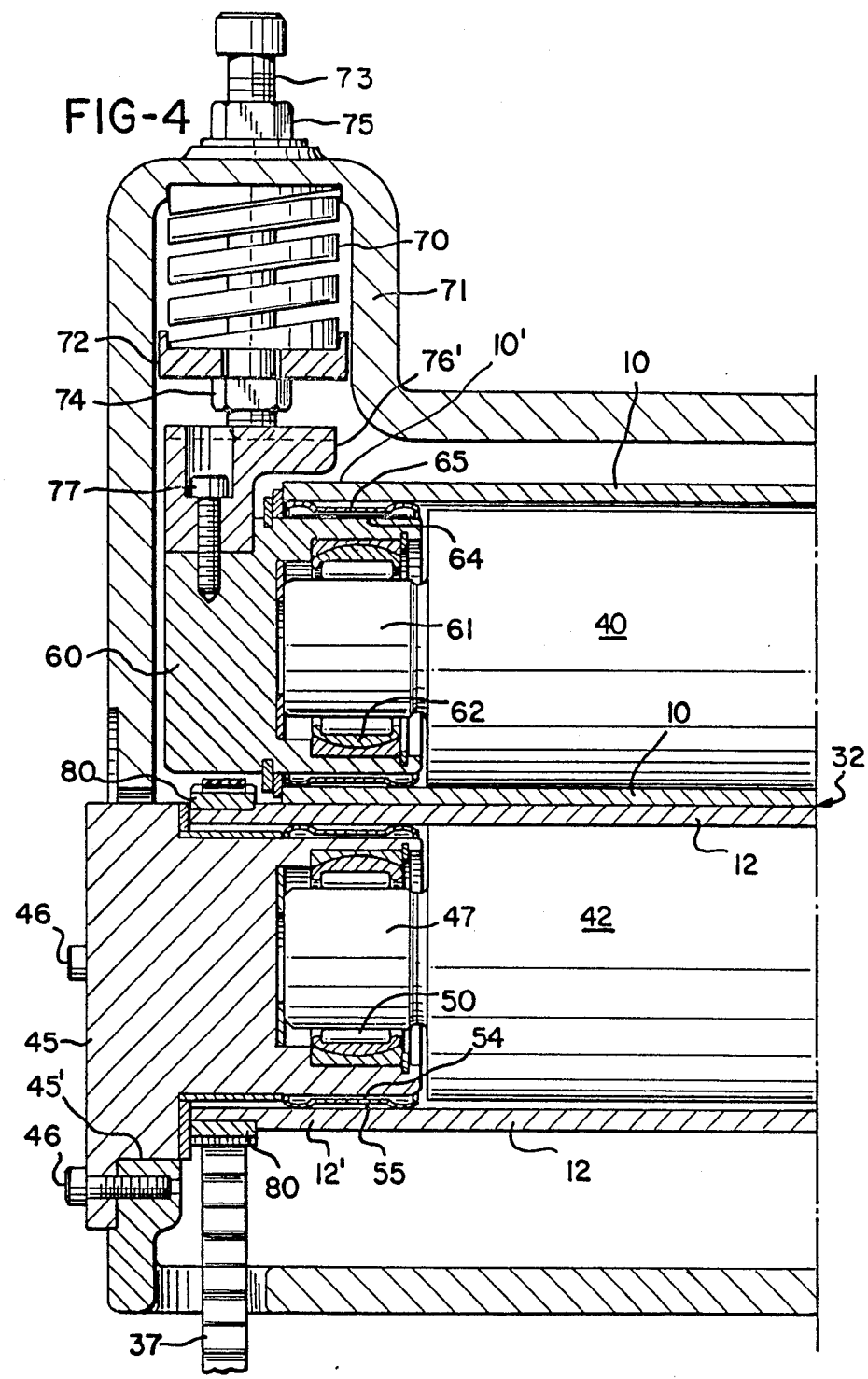
FIG. 4 is an enlarged fragmentary transverse secton through the developer showing the manner in which the rolls are mounted.

The bearing blocks which support the ends of the loading rolls are essentially the same at either end. The enlarged detail, as shown in FIG. 4, illustrates the bearing arrangement within the frame end 26. This arrangement is duplicated in the opposite frame end 25, except for the driving cog wheel for the roll 12. The lower rolls 40, 42 are mounted for rotation on the frame 20 on fixed journal blocks 45 at each end of the roll pairs. The blocks 45 are mounted in openings 45' formed in the end walls 25, 26 and held by cap screws 46.

The journal block 45 is illustrated in transverse section in FIG. 4 and receives the bearing spindle 47 of the loading roll 42, in a self-aligning bearing 50. The journal block 45 also has an annular surface 54 on which is supported a needle or roller bearing 55. The surface 54 is offset or eccentric to the center of the bearing 50. The outer race of the bearing 55 is received on a suitable inside surface of the pressure roll 12, in an end extension portion 12' thereof substantially in vertical alignment with the self-aligning bearing 50.

The surfaces 54 and the associated bearings 55 support the pressure roll 12 in such a manner that there is a minimum of load carried on the bearings 55 when the crowned rolls 40 and 42 are fully loaded. In the loaded condition the bearing spindles 47 of the crowned roll 42 are deflected slightly from an unloaded position as represented by the reference line 57 in FIG. 3 to a loaded position a represented by the reference line 58 in FIG. 3. Since the apparatus is maintained in a loaded condition, the geometric center of the annular surface 54, for the purpose of supporting the pressure roll 12, is determined by taking into account the loaded condition of the crowned rolls, so that when the pressure rolls are loaded, the barings 55 are substantially unloaded.

Figure 5:
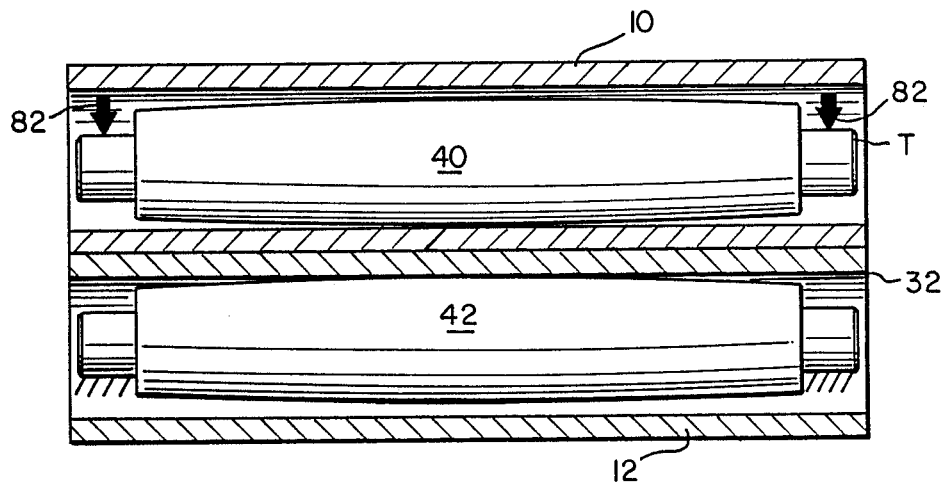
FIG. 5 is a transverse diagrammatic view of the rolls further illustrating the principles of operation.

The upper pressure roll 10 and its associated loading roll 40 are carried on movable journal blocks 60, one of which is shown in transverse section in FIG. 4. The blocks 60 similarly rotatably support the journals or spindles 61 at the ends of the roll 40, in self-aligning bearings 62, corresponding to the bearings 50. Similarly, the blocks 60 are provided with an eccentrically offset bearing support surface 64, for supporting an annular needle or roller bearing 65. The bearing is internally received within an end extension portion 10' of the pressure roll 10. The bearing 65 is positioned in transverse alignment with the self-aligning bearing 62. The center of bearing support surface 64 is also offset or eccentric to the center of the bearing 62, to accommodate the deflection of the roll 40, as illustrated in FIG. 3. Therefore, a minimum of loading is applied at the needle bearings 65, and the ends of the pressure rolls 10 and 12 may thus be considered to be free and unloaded, as shown in the diagram of FIG. 5.

Means for loading the pressure rolls 10 and 12 through the loading rolls 40 and 42 include a pair of compression springs 70. The upper ends of the springs 70 are received in spring housing portions 71 of the frame. The lower spring ends are carried on collars 72 which, in turn, are retained on rods 73 by adjustable nuts 74. The maximum downward position of a rod 73 may be controlled by an external threaded nut 75 on the rod. The lower ends of the rods 73 engage pads 76' which form the inner ends of radius arms 76 (FIG. 2). The pads 76' and therefore the arms 76 are attached to the journal block 60 by means of threaded cap screws 77 (FIG. 4).

The forward ends of the arms 76 are mounted for pivotal movement on the frame 20, in self-aligning bearings 78, as shown in FIG. 6. The bearings 78 are piloted on threaded stud shafts 79 carried on forward portions on the respective side members of the frame 20. The bearings 78 permit pivotal and self-aligning movement of the arms 76, as may occur with the loading of the crowned roll 40, and as also may occur with the deflection of the pressure roll 10 with respect to the roll 12, during the passage of sheet material through the nip 32.

The force of the pressure springs 70 is transmitted through the collars 72 directly to the rods 73 and through the arms 76 to the bearing blocks 60. This force is transmitted to the crown loading roll 40 through the self-aligning bearings 62 and the roll trunions 61.

As noted earlier, the motor 36 provides a motive driving force to the roll pair 10, 12, through a belt 37. The latter engages a cog pulley 80 mounted on the extended end of the pressure roll 12, axially outwardly of the bearing 50, as shown in FIG. 4.

For proper operation, the pressure rolls 10 and 12, as well as the loading rolls 40 and 42, should have a high hardness. Particularly, the pressure rolls 10 and 12 should be surface hardened since they must be protected against jams in which paper may go through in multiple thicknesses, at fold-overs and the like, which can result in substantially increased localized loading.

The rolls may be loaded in the region of 500 pli (89 Kg/cm) which, with typical 9-inch rolls as illustrated, loaded over 8.5 inches require a load of 2,125 pounds (964 Kg) applied by the springs 70 at the journal ends. A surface hardness in the order of 60 Rockwell C on the rolls 10 and 12 is preferred. Rolls 10 and 12 may be chromium plated on the exposed outer surfaces, and all of the rolls should be case hardened.

Preferably, the pressure rolls 10 and 12 run in contact with each other when no sheet material is in the nip 32. Thus, when a sheet enters the nip, it must force the rolls apart. The ability of a sheet to enter is dependent upon the diameters of the rolls, and for small rolls this may create a problem. Therefore, it is within the scope of the invention to provide stop means (not shown) engageable with the journal blocks 60 so as to maintain a minimum small gap between the rolls, such as in the order of 0.001" (0.25 mm) to reduce the angle of the roll at the point where the sheet first contacts the rolls, thus enabling a greater separation force to be generated as the sheet enters. If desired, the sheet feed mechanisms disclosed in the copending application Ser. No. 009,815 may be used to assist and direct the feeding of the sheet to the rolls.

The principle of operation of the roll-type pressure developer of this invention is illustrated in FIG. 5. The arrows 82 represent the compression forces applied by the springs 70 to the journal ends of the upper loading roll 40 which, in turn, apply an equal and opposite reaction force to the journal ends of the lower loading roll 42. It is course immaterial which of the two loading rolls is loaded and which is supported against the reactive forces.

It will also be seen that the loading as applied by the loading rolls 40 and 42, is directed to the inside surfaces of the respective pressure rolls and immediately adjacent the nip 32. Accordingly, the pressure rolls themselves are not required to transmit the loading forces diametrically through the rolls, as in the case of a three roll or four roll system in which the loading rolls contact diametrically opposite surfaces of the pressure rolls. The thickness of the pressure rolls 10 and 12 at the nip act as a smoothing filter and disperse the energy of any uneven loading between a pressure and loading roll.

The arrangement of this invention, by providing loading rolls internal to the pressure rolls, permit the spaces therebetween, if desired, to be closed and sealed against intrusion of dirt and the like. Further, such internal spaces between the respective roll pairs may be partially or fully filled with a lubricant, if desired.

The operation of the roll-type pressure developer is largely self-evident from the foregoing description. The motive force is applied by the motor 36 through the cog belt 37, thereby to drive the lower pressure roll 12. The force across the nip 32 will be substantially uniform, at the design pressure, by reason of the uniform loading on the nip provided by the crowned rolls 40 and 42. While it is within the scope of this invention to employ a single crowned roll, whereby many of the advantages may be obtained, it is preferred to use a pair of crowned rolls as illustrated. Also, if desired, the ends of the rolls 10 and 12 may be sealed and a suitable lubricant introduced inside between the associated pressure and loading roll.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. In pressure development apparatus for developing imaging sheets in which a sheet to be developed is passed through the nip defined between a pair of cylindrical pressure rolls, the improvement comprising:
   each of said pressure rolls being annular in section and having a cylindrical outer surface and a coaxial cylindrical inside surface,
   a pair of crowned loading rolls, one for each said pressure rolls, each of said loading rolls having a diameter less than the inside diameter of said pressure rolls and received in a respective one of said pressure rolls for coaction against said inside surface thereof,
   a roller support frame having a pair of spaced side frame members,
   journal means mounting the ends of said loading rolls for rotation in said frame side members while providing for deflection of said loading rolls under load,
   means mounting said pressure rolls for rotation about said loading rolls, and
   force means acting on said journal means and loading the nip between said pressure rolls through said loading rolls accompanied by deflection of said loading rolls within said pressure rolls to provide a generally uniform nip pressure along the length thereof corresponding to the width of sheet to be pressure developed therebetween.

2. The apparatus of claim 1 in which said pressure rolls are also mounted for rotation on said journal means.

3. The apparatus of claim 2 in which said journal means includes a first pair of journal blocks associated with one of said loading rolls and a second pair of journal blocks associated with the other of said loading rolls, one pair of said journal blocks being fixedly mounted in said side frame members, and the other pair of said journal blocks being movably mounted in said side frame members, and said force means includes springs in said side frame members bearing on said movably mounted journal block pair.

4. In a roll-type pressure developer in which a latent image on sheet material is processed by subjecting the sheet material to a high-pressure nip defined between a pair of pressure rolls, the improvement comprising:
   frame means mounting said rolls for rotation in nip-forming relation to each other,
   at least one of said rolls formed as an annulus, a crowned loading roll received in said one roll and having an effective length substantially corresponding to the width of said sheet material, and
   means loading said crowned roll against the inside surface of said one roll opposite said nip for applying a uniform force along said nip through said one roll and permitting said crowned roll to rotate independently of said one roll.

5. The developer of claim 4 in which each of said pressure rolls is an annulus, and a crowned loading roll is received in each of said pressure rolls, and each of said loading rolls is loaded to urge its associated pressure roll against said nip.

6. A roll-type pressure web treating apparatus for subjecting sheet or web material to high uniform pressure across a nip between a pair of pressure rolls, comprising:
   first and second annular pressure rolls,
   means mounting said pressure rolls for rotation in nip-defining relation to each other,
   a first crowned loading roll received within said first pressure roll, journal means mounting said first loading roll for rotation independently of said first pressure roll, loading means engaging said journal means and urging said first pressure roll into said nip, and
   a second crowned loading roll received within said second pressure roll, journal means mounting said second loading roll for rotation in loading relation to and independent of said second pressure roll for defining a uniform pressure relation along said nip.

7. The apparatus of claim 6 in which said journal means rotatably supports said first pressure roll and said first loading roll, and second journal means rotatably supports said second pressure roll and said second loading roll.

* * * * *